United States Patent
Astigarraga et al.

(10) Patent No.: US 9,571,126 B2
(45) Date of Patent: *Feb. 14, 2017

(54) CONVOLUTION-ENCODED HYPER-SPEED CHANNEL WITH ROBUST TRELLIS ERROR-CORRECTION

(71) Applicant: INTERNATIONAL BUSINESS MACHINES CORPORATION, Armonk, NY (US)

(72) Inventors: Tara Astigarraga, Fairport, NY (US); Louie A. Dickens, Tucson, AZ (US); Michael D. Hocker, Staatsburg, NY (US); Michael E. Starling, Bonsall, CA (US); Daniel J. Winarski, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/095,379

(22) Filed: Apr. 11, 2016

(65) Prior Publication Data

US 2016/0226524 A1    Aug. 4, 2016

Related U.S. Application Data

(63) Continuation of application No. 14/281,398, filed on May 19, 2014, now Pat. No. 9,374,108.

(51) Int. Cl.
*H03M 13/29* (2006.01)
*H03M 13/25* (2006.01)
(Continued)

(52) U.S. Cl.
CPC .......... *H03M 13/256* (2013.01); *H03M 13/25* (2013.01); *H03M 13/39* (2013.01); *H03M 13/3961* (2013.01); *H04L 1/00* (2013.01)

(58) Field of Classification Search
CPC ................................ H03M 13/2957
(Continued)

(56) References Cited

U.S. PATENT DOCUMENTS 3,789,360 A    1/1974  Clark, Jr. et al.
5,029,331 A *  7/1991  Heichler ............... H03M 13/23
                                                       714/790

(Continued)

FOREIGN PATENT DOCUMENTS

CN    103072386 A    5/2013

OTHER PUBLICATIONS

Internet Society et al., "Simple Reed-Solomon Forward Error Correction (FEC) Scheme for FECFRAME," An IP.com Prior Art Database Technical Disclosure, Feb. 28, 2013 (47 pages).

(Continued)

*Primary Examiner* — Fritz Alphonse
(74) *Attorney, Agent, or Firm* — Griffiths & Seaton PLLC (57) ABSTRACT

A method, system, and computer program product for performing robust, parallel data transfer by a processor device. Data is segmented into k-bit segments, where $k \geq 1$. The k-bit segments are convolution encoded, using $m \geq 1$ stages of delay. The n output streams are transmitted in parallel for increased effective data rate, where $n > k$. The n output streams are received. An XOR (Exclusive OR) logic is applied to the n output streams with pathing allowed by the convolution encoding, in a trellis-decoding diagram.

19 Claims, 12 Drawing Sheets

(51) Int. Cl.
*H03M 13/39* (2006.01)
*H04L 1/00* (2006.01)

(58) Field of Classification Search
USPC ............... 714/755, 773, 748, 790, 792, 763
See application file for complete search history.

(56) References Cited

U.S. PATENT DOCUMENTS

| | | |
|---|---|---|
| 5,123,109 A | 6/1992 | Hillis |
| 5,765,186 A | 6/1998 | Searby |
| 7,103,821 B2 | 9/2006 | Lakshmanamurthy et al. |
| 2005/0144272 A1 | 6/2005 | Herzberg |
| 2011/0145671 A1* | 6/2011 | Moon ................... H04L 1/0048 714/748 |
| 2011/0239093 A1* | 9/2011 | Radke ................. G06F 11/1068 714/773 |
| 2011/0302358 A1 | 12/2011 | Yu et al. |

OTHER PUBLICATIONS

Internet Society et al., "RTP Payload Format for Raptor Forward Error Correction (FEC)," An IP.com Prior Art Database Technical Disclosure, Aug. 15, 2012 (37 pages).

\* cited by examiner

FIG. 1

| INITIAL STATE | DESTINATION STATE | INPUT INFORMATION | CODED DATA |
|---|---|---|---|
| S0 | S0 | 0 | 00 |
| S0 | S1 | 1 | 11 |
| S1 | S2 | 0 | 01 |
| S1 | S3 | 1 | 10 |
| S2 | S4 | 0 | 11 |
| S2 | S5 | 1 | 00 |
| S3 | S6 | 0 | 10 |
| S3 | S7 | 1 | 01 |
| S4 | S0 | 0 | 11 |
| S4 | S1 | 1 | 00 |
| S5 | S2 | 0 | 10 |
| S5 | S3 | 1 | 01 |
| S6 | S4 | 0 | 00 |
| S6 | S5 | 1 | 11 |
| S7 | S6 | 0 | 01 |
| S7 | S7 | 1 | 10 |

| XOR FUNCTION |
|---|
| 0 XOR 0 = 0 |
| 0 XOR 1 = 1 |
| 1 XOR 0 = 1 |
| 1 XOR 1 = 0 |

| INITIAL STATE | DESTINATION STATE | INPUT INFORMATION | CODED DATA |
|---|---|---|---|
| $S_0$ | $S_0$ | 00 | 000 |
| $S_0$ | $S_1$ | 10 | 101 |
| $S_0$ | $S_2$ | 01 | 011 |
| $S_0$ | $S_3$ | 11 | 110 |
| $S_1$ | $S_0$ | 00 | 111 |
| $S_1$ | $S_1$ | 10 | 010 |
| $S_1$ | $S_2$ | 01 | 100 |
| $S_1$ | $S_3$ | 11 | 001 |
| $S_2$ | $S_0$ | 00 | 100 |
| $S_2$ | $S_1$ | 10 | 001 |
| $S_2$ | $S_2$ | 01 | 111 |
| $S_2$ | $S_3$ | 11 | 010 |
| $S_3$ | $S_0$ | 00 | 011 |
| $S_3$ | $S_1$ | 10 | 110 |
| $S_3$ | $S_2$ | 01 | 000 |
| $S_3$ | $S_3$ | 11 | 101 |

CONVOLUTION-ENCODED HYPER-SPEED CHANNEL WITH ROBUST TRELLIS ERROR-CORRECTION

CROSS-REFERENCE TO RELATED APPLICATIONS

This Application is a Continuation of U.S. patent application Ser. No. 14/281,398, filed on May 19, 2014.

BACKGROUND OF THE INVENTION

Field of the Invention

The present invention relates in general computing systems, and more particularly to, various embodiments for effecting data transfer in a rapid, efficient manner with robust error correction capability.

Description of the Related Art

Today with modern technology, large volumes of data are storable on hard disk drives (HDD) and solid state drives (SSD); these drives can exist as a solo entity, or as part of a broader make up within a larger storage environment. In addition, the large amount of data may need to be transferred between storage locations for reasons such as data redundancy, security, and operational efficiency, particularly in enterprise scenarios, but also becoming more of a common occurrence in everyday consumer use.

SUMMARY OF THE INVENTION

With the rise of the sheer amount of data stored and manipulated by users, so too has the need for efficient and robust data transfer. For example, it may be desired for the data to be replicated between two geographical locations to provide redundancy and enhance data security in the event that one geographical location becomes inaccessible to the user, or the data becomes corrupted or destroyed. A continuing and increasing need exists for a solution whereby large amounts of data may be transferred in a relatively short period of time, yet at the same time ensuring that the data that is transferred is as error-free as possible.

Accordingly, and in view of the foregoing, various embodiments for performing robust, parallel data transfer by a processor device are provided. In one embodiment, by way of example only, a method for providing such robust, parallel data transfer by a processor device is provided. Data is segmented into k-bit segments, where k≥1. The k-bit segments are convolution encoded, using m≥1 stages of delay. The n output streams are transmitted in parallel for increased effective data rate, where n>k. The n output streams are received. An XOR (Exclusive OR) logic is applied to the n output streams with pathing allowed by the convolution encoding, in the trellis-decoding diagram.

Other system and computer program product embodiments are provided and supply related advantages.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

With the proliferation of digital information in today's society, the need for data management, storage, transfer, and other processing characteristics on an increasingly large and yet, efficient scale, has also become commensurately important. Accordingly, the mechanisms of the illustrated embodiments attempt to address two data processing-related challenges with a single solution; namely the ability to transmit and receive data in parallel, for so-called "hyper channel" speeds, and yet, the ability to provide the data a highly robust error correction code such that up to, for example, up to 50% of the non-sequential data bits could be in error and the data continues to be read successfully.

To address these dual challenges of quick data transfer with accompanying robust error correction, the mechanisms of the illustrated embodiments employ a convolution encoding of the data, and moreover, that such convolution-encoded data is sent over separate links/channels in a parallel configuration for hyper-fast transmission speeds. Later, to recover the data, the mechanisms of the illustrated embodiments utilize trellis-decoding functionality, such that the received information is decoded robustly.

Figure 1:
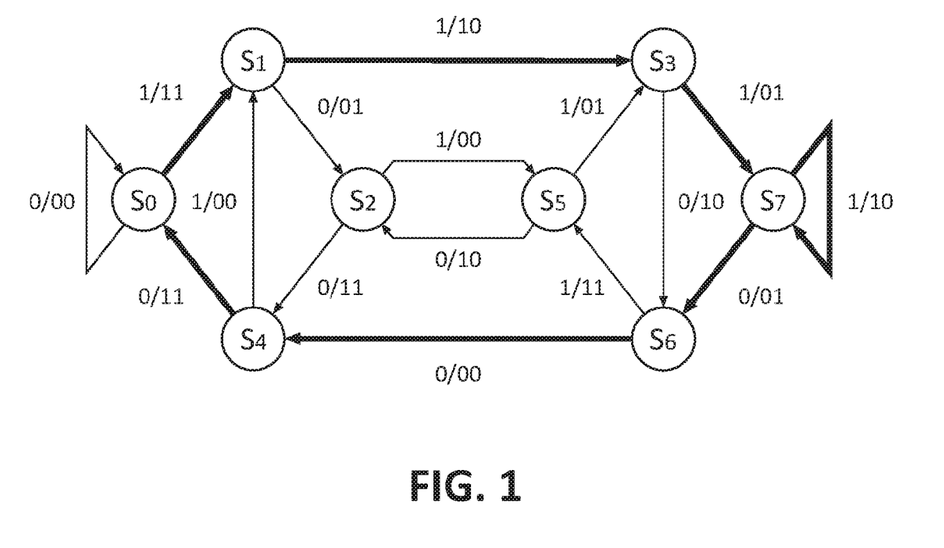
FIG. 1 is an illustration of an exemplary encoder state diagram for a (2,1,3) Binary Convolution Encoder, showing exemplary convolution encoding in which aspects of the present invention may be realized, and in particular, illustrating binary 1111000 convolution encoded into binary 1110010010011.

Turning first to FIG. 1, a block diagram of an exemplary convolution encoder state diagram is depicted, in which aspects of the present invention may be realized. The depicted encoder state diagram shows a (n=2, k=1, m=3) binary convolution encoder having two outputs, one input, and three stages of delay. One of ordinary skill will appreciate that to effect various aspects of the illustrated embodiments, a variety of other encoders may be implemented; but for purposes of brevity and simplicity, the depicted encoder is shown.

As shown, the state diagram has 8 available states $S_0$-$S_7$ (number of states=$2^{km}=2^3=8$), two branches entering each state (branches per state=$2^k=2^1=2$), and two branches leaving each state (branches per state=$2^k=2^1=2$). As the input information moves from initial state to destination state, the input information results in the respective coded data shown. For example, at $S_0$, if the input information is 0, the encoder remains at $S_0$, and the outputted coded data is 00. If however, the input information is 1, the encoder's outputted coded data is 11, and the state changes to $S_1$ (as indicated by the dark-highlighted line). If, at state $S_1$, the input information is then 1, the applicable state changes to $S_3$ (as indicated by the dark-highlighted line), and the outputted coded data is 10. If however, the input information is 0, the state changes to $S_2$, and the outputted coded data is 01 as shown. Conceptually speaking, the depicted convolution encoding may be thought of as a game of hopscotch, where the direction taken is based on the incoming bit, and the outcome/output are two encoded bits.

The dark-highlighted line shown in FIG. 1 illustrates exemplary convolution encoding of 1111000 (original data) into 11100110010011 (encoded data) by this process. To wit: (a) $S_0$ to $S_1$ encodes 1 as 11, (b) $S_1$ to $S_3$ encodes 1 as 10, (c) $S_3$ to $S_7$ encodes 1 as 01, (d) $S_7$ to $S_7$ encodes 1 as 10, (e) $S_7$ to $S_6$ encodes 0 as 01, (f) $S_6$ to $S_4$ encodes 0 as 00, and (g) $S_4$ to $S_0$ encodes 0 as 11.

Figure 2:
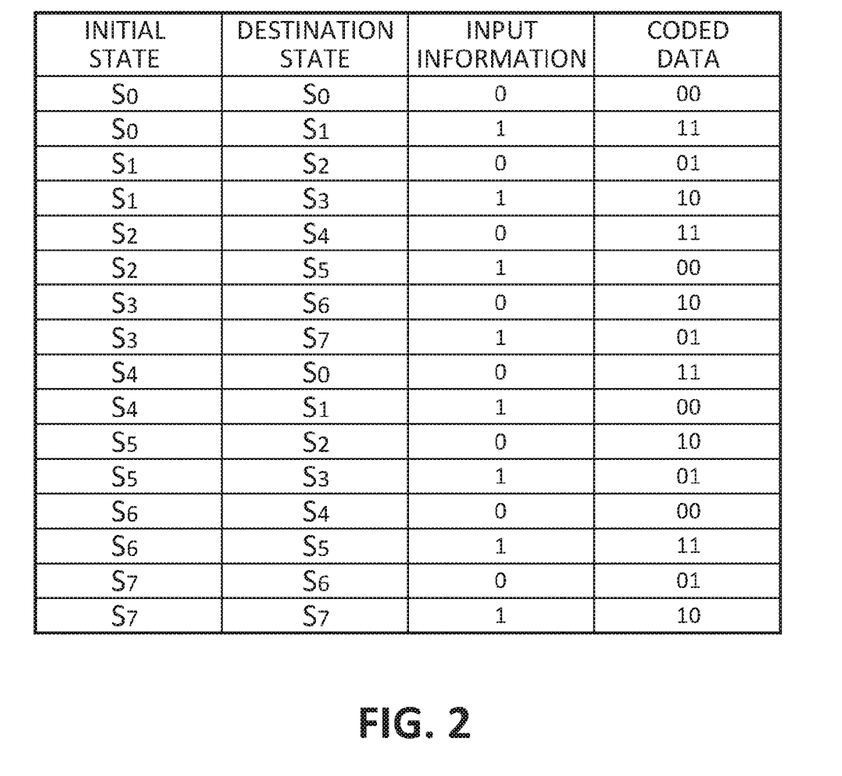
FIG. 2 is a table diagram showing the exemplary convolution encoding previously shown in FIG. 1, in table form.

FIG. 2 is the encoder state diagram for a (2,1,3) code, but in table form. Here again, in, for example, initial state $S_1$ moving to destination state $S_3$ encodes 1 as 10, as shown in row four of this table.

Figure 3:
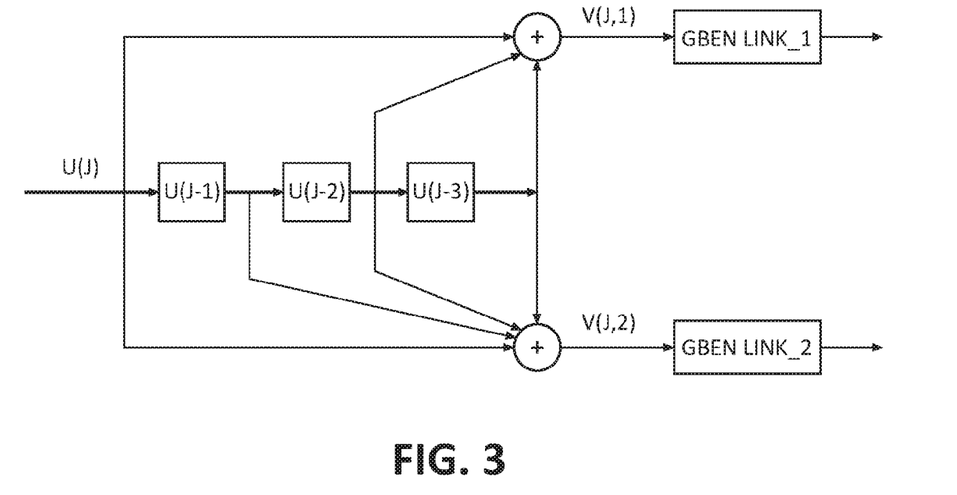
FIG. 3 is a block diagram illustration of an exemplary (2,1,3) Binary Convolution Encoder, again in which aspects of the present invention may be realized.

FIG. 3, following, is a block diagram depiction of the (2,1,3) convolution encoder itself, with 2 outputs V(J,1) and V(J,2), each output V being a separate GbEN (Gigabit Ethernet) link (e.g., GBEN_LINK_1 and GBEN LINK_2 as shown) for communication. Thus, the input U(J) is convolved into two separately transmitted message streams V(J,1) and V(J,2) which are transmitted on separate Gigabit Ethernet (GbEN) links. In addition to the depicted GbEN links, other communications links may be implemented, such as Fibre Channel (FC), Fibre Channel over Ethernet (FCoE), Infiniband, Small Computer Systems Interface (SCSI), Internet Small Computer Systems Interface (iSCSI), and the like. The blocks U(J−1), U(J−2), and U(J−3) indicate the stages of delay, respectively.

Figure 4:
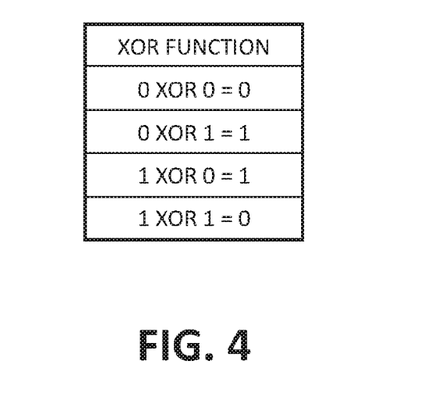
FIG. 4 is a table diagram of the exclusive or (XOR) function.

FIG. 4, following, is a table diagram that illustrates the XOR (exclusive or) function. As shown, 0 XOR (exclusive or'ed) with 0=0, 0 XOR 1=1, 1 XOR 0=1, and 1 XOR 1=1.

Figure 5:
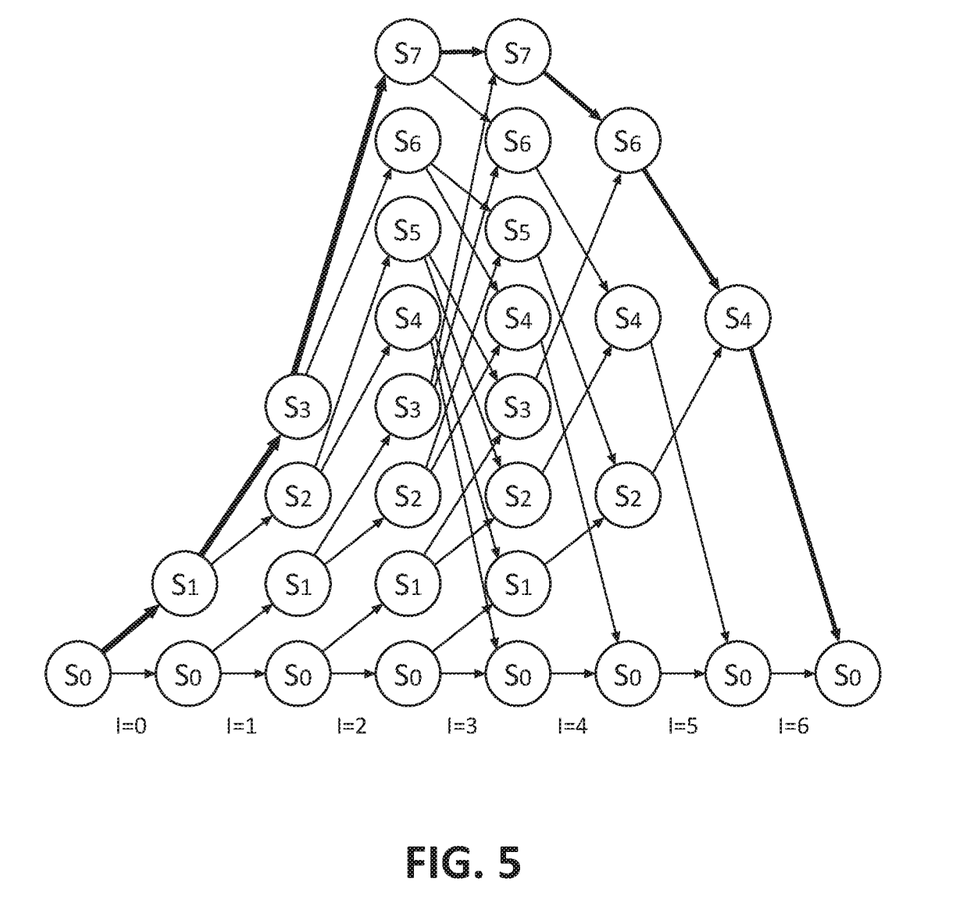
FIG. 5 is a trellis-decoding diagram for the (2,1,3) Binary Convolution Encoder previously illustrated in FIG. 3 and encoding illustrated in FIGS. 1 and 2, previously, for exemplary decoding of binary 11100110010011 into the original binary 1111000.

Turning now to FIG. 5, a trellis-decoding diagram for the (2,1,3) Binary Convolution Encoder previously illustrated in FIG. 3 and encoding illustrated in FIGS. 1 and 2, previously, is shown, here again in which aspects of the present invention may be implemented.

In one embodiment, to receive and decode the data, a trellis diagram is used, such as shown in FIG. 5. As shown, iterations I=0 to I=6 demonstrate the decoding of 11100110010011 (encoded data) back into 1111000 (original data) by this process (dark-highlighted line): (I=0) $S_0$ to $S_1$ decodes 11 as 1, (I=1) $S_1$ to $S_3$ decodes 10 as 1, (I=2) $S_3$ to $S_7$ decodes 01 as 1, (I=3) $S_7$ to $S_7$ decodes 10 as 1, (I=4) $S_7$ to $S_6$ decodes 01 as 0, (I=5) $S_6$ to $S_4$ decodes 00 as 0, and (I=6) $S_4$ to $S_0$ decodes 11 as 0. The path shown in FIG. 5 is chosen via the XOR function previously shown in FIG. 4 to have a zero Hamming radius, which means that each bit in the output of the XOR operation is a zero.

Figure 6A:
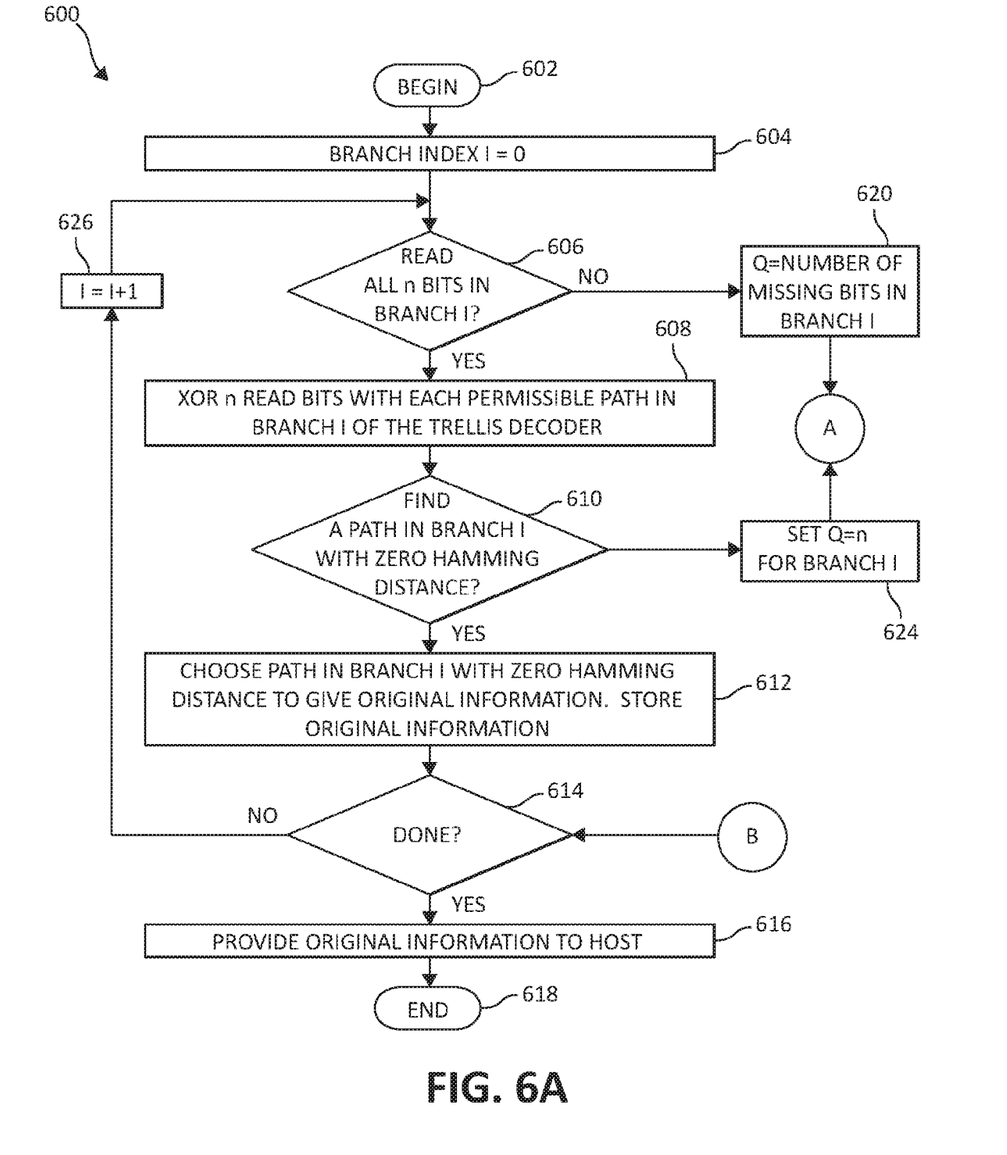
FIG. 6A is a flow chart diagram of an exemplary embodiment for decoding functionality with error correction, in which aspects of the present invention may be realized.

Turning now to FIG. 6A, a flow chart diagram of an exemplary embodiment for decoding functionality with error correction is depicted (describing in method form, for example, the trellis decoding functionality previously graphically depicted in FIG. 5), in which aspects of the present invention may be realized. Here, method 600 begins (step 602) at trellis branch index I=0 (step 604).

At decision step 606, method 600 queries if all n bits in branch I have been read. If not, then Q is defined as the number of missing bits in branch I (step 620), and the method 600 continues through "A" to FIG. 6B, following. Returning to step 606, if all n bits in branch I have been read, then method 600 moves to step 608, where the n read bits are XOR'ed with each permissible path in branch I of the trellis decoder. In the following decision step 610, if a path is not found in branch I with zero Hamming radius, the method 600 sets Q=n for branch I and moves through "A" to FIG. 6B as described previously.

Returning to step 610, if a path is found in branch I with zero Hamming radius, a path is then chosen in branch I with zero Hamming radius to give the original information. The original information is then stored (step 612).

Moving to decision step 614, if the decoding is complete, the method continues to step 616, where the information is provided to the host, and the method 600 then ends (step 618). If the decoding is not complete, (again, decision step 614), then the method 600 iterates one step (I=I+1) (step 626), and the method 600 returns to decision step 606 as shown.

Figure 6B:
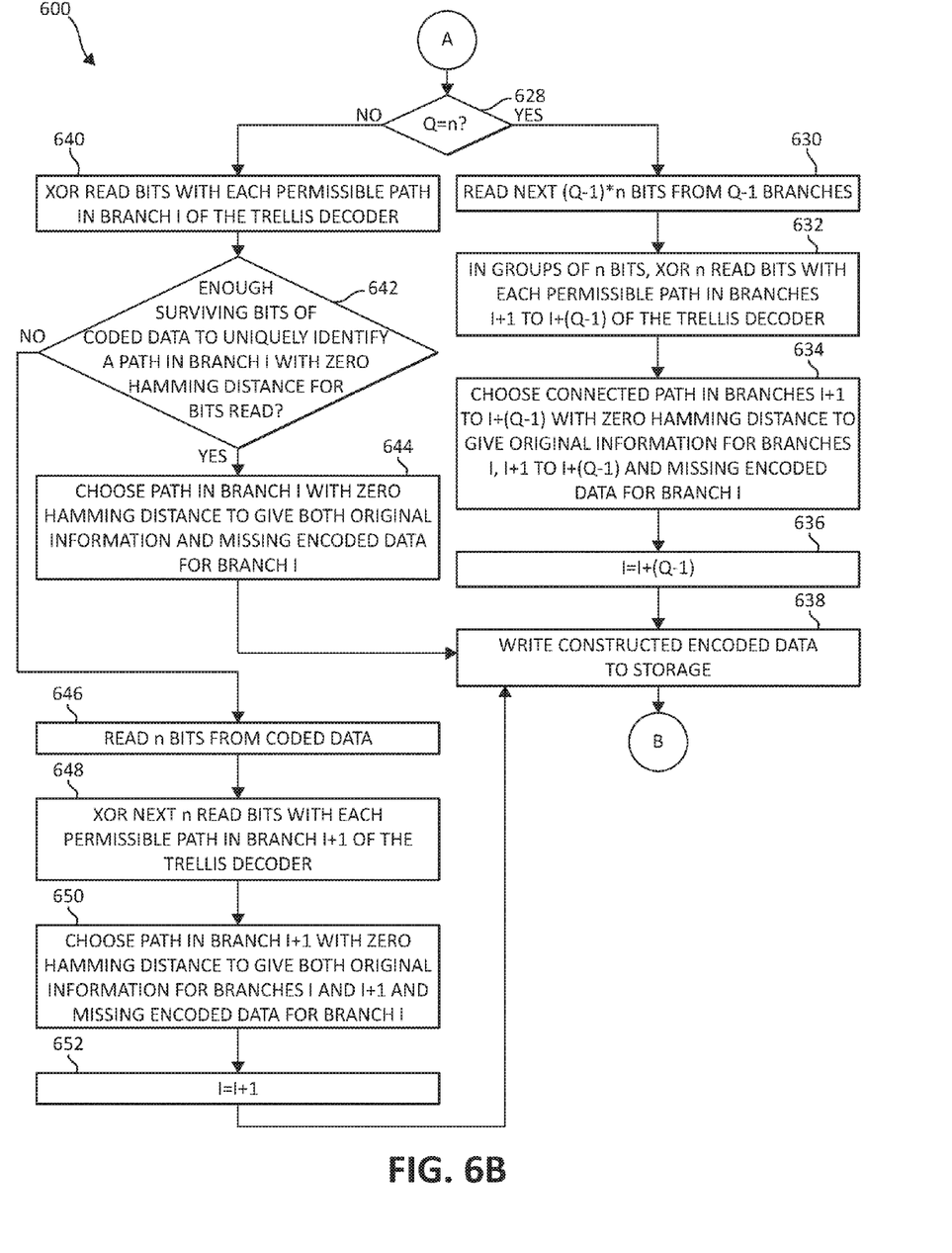
FIG. 6B is an additional flow chart diagram of a continuation of the exemplary decoding functionality with error correction first depicted in FIG. 6A, previously, here again in which aspects of the present invention may be realized.

Returning to "A," which follows a determination of missing read bits in branch I and or a lack of a finding of zero Hamming radius (decision steps 606 and 610, respectively), FIG. 6B, following, continues the exemplary decoding functionality previously began in FIG. 6A. In decision step 628, method 600 queries whether Q=n. If no, the read bits in the instant branch I are XOR'ed with each permissible path in branch I of the trellis decoder (step 640).

In a following decision step 642, if enough surviving bits of coded data to uniquely identify a path in branch I with zero Hamming radius for the applicable bits read are identified, then a path is chosen in branch I with zero Hamming radius to give both original information and missing encoded data for branch I (step 644), and the constructed encoded data is then written to storage (step 638), while the method 600 continues through "B" returning to FIG. 6A, previously.

Returning to decision step 642, alternatively, if enough surviving bits of coded data are not found, then the method 600 moves to step 646, where n bits are read from coded data. In a following step 648, the next n read bits are XOR'ed with each permissible path in branch I+1 of the trellis decoder. The path in branch I+1 with zero Hamming radius to give both original information for branches I and I+1, and missing encoded data for branch I, is chosen (step 650). The method then iterates the instant branch I (I=I+1) as in step 626 previously (step 652), and then continues to step 638 as described previously.

Returning now to decision step 628, if Q=n, then the next (Q−1)*n bits are read from Q−1 branches (step 630). As a following step 632, in groups of n bits, n read bits are XOR'ed with each permissible path in branches I+1 to I+(Q−1) of the trellis decoder. A connected path in branches I+1 to I+(Q−1) with zero Hamming radius is chosen to give original information for branches I, I+1 to I+(Q−1) and missing encoded data for branch I (step 634). I is then iterated to be I=I+(Q−1) (step 636), and the method 600 writes the constructed encoded data to storage in step 638 as described previously, while then returning through B to FIG. 6A, previously.

To revisit, FIGS. 6A and 6B describe the trellis decoding process, using the XOR function, to search for the path with zero Hamming radius. Q is the number of missing bits in branch I; accordingly, it is possible to reconstruct missing information via the aforementioned trellis decoder. In other words, a significant number of random bits can be missing (i.e., up to 50% for (2,1,3) encoded data), and the entire message may still be reconstructed based on the zero Hamming radius criteria achieved by the use of the XOR function.

In one embodiment, each packet of the data to be transmitted may be identified by sequence number and which output of a respective convolution encoder the instant packet originated. When the data is received at the destination location and decoded, the transmitted packets may then be reassembled based on the sequence number and the respective output port.

Figure 7:
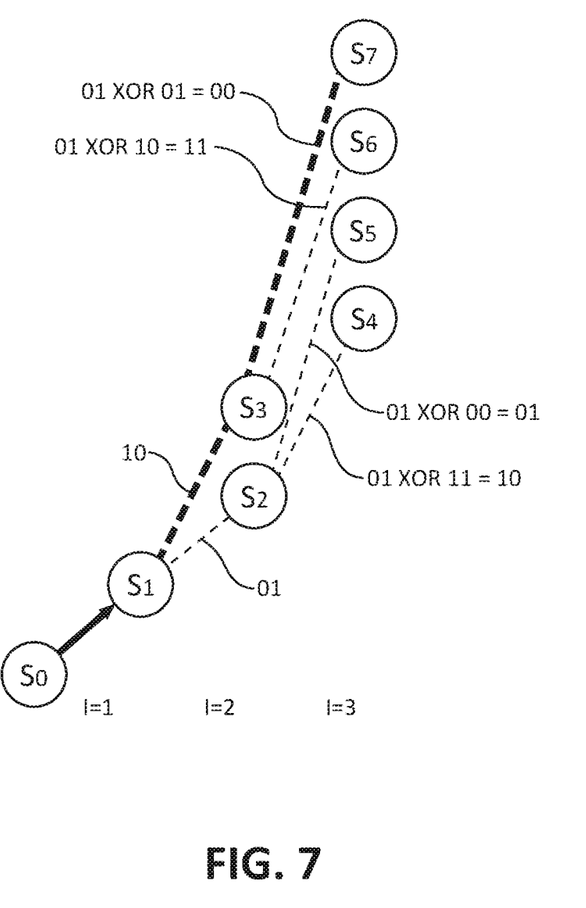
FIG. 7 is a portion of an exemplary trellis-decoding diagram for exemplary decoding of binary 11100110010011 into the original binary 1111000, where the two bits of information for iteration I=1 are missing.

We assume now in the following example, that the two bits of information for iteration I=1 are totally missing, namely we don't know if the information should be 10 or 01. In FIG. 7, following, the decoding for iteration I=2 shows that path $S_1$ to $S_3$ to $S_7$ is the correct path, with a zero Hamming radius as determined by the XOR operator. 01 XOR 01=00 (XOR of received information with a path in the trellis decoder), which is thus the desired path in iteration I=2, and thus $S_1$ to $S_3$ to $S_7$ is the correct path and we have thus established that the missing information from iteration I=1 is 10.

FIGS. 1-7, previously, teach convolution-trellis ENDEC (encoding-decoding) for a simple (2,1,3) binary convolution encoder, but without a gain in transmission speed, because there are 2 outputs but the code rate is ½ (2 bits out for each bit in). The speed efficiency comes with convolution encoders with more outputs.

Figure 8:
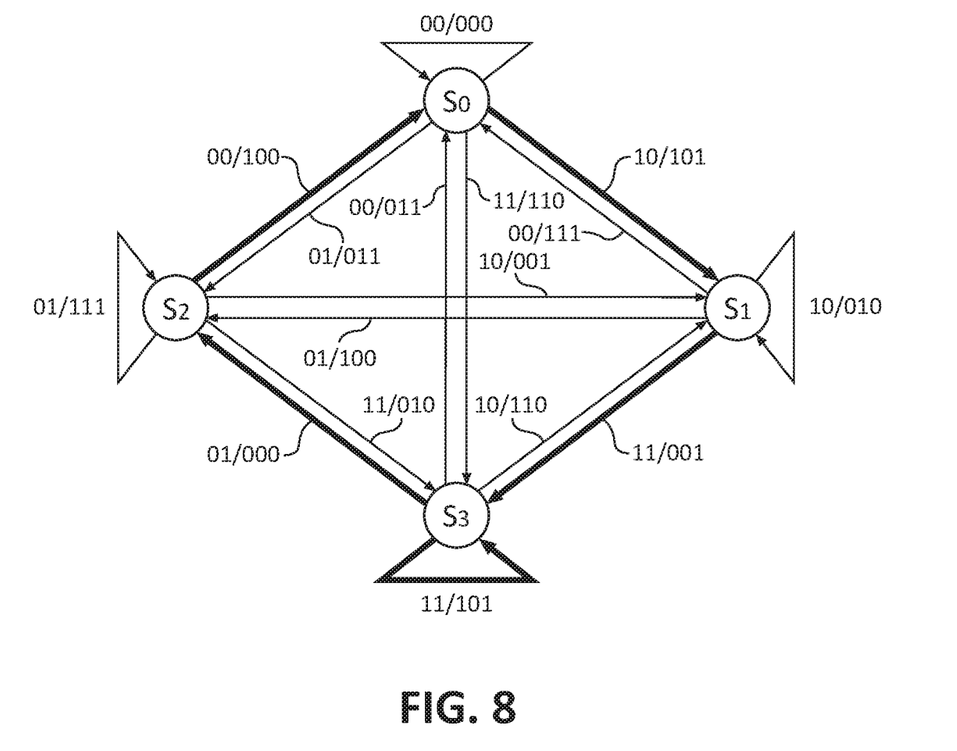
FIG. 8 is an illustration of an exemplary encoder state diagram for a (3,2,1) Binary Convolution Encoder, in which binary 10111110100 is convolution encoded into binary 101001101000100.

For example, in FIG. 8, following, is an exemplary encoder state diagram for a (n=3,k=2,m=1) binary convolution encoder (3 outputs, 2 inputs, and 1 stage of delay). Although FIGS. 8-11 as follows are more complicated than FIGS. 1-7, FIGS. 8-11 are better understood thanks to the introduction and overview provided by FIGS. 1-7. It is the functionality behind FIGS. 8-11 that provide enablement for the transmission of data in parallel for faster effective data rate, while providing a highly robust error correction code which spans the entire parallel process.

There are four states in FIG. 8 (number of states=$2^{km}=2^2=4$), four branches entering each state (branches per state=$2^k=2^2=4$), and four branches leaving each state (branches per state=$2^k=2^2=4$). As an illustrative example, in FIG. 8, which shows Encoder State Diagram for a (3,2,1) binary convolution encoder, encodes 1011110100 into 101001101000100 (dark-highlighted line) by this process: (a) $S_0$ to $S_1$ encodes 10 as 101, (b) $S_1$ to $S_3$ encodes 11 as 001, (c) $S_3$ to $S_3$ encodes 11 as 101, (d) $S_3$ to $S_2$ encodes 01 as 000, (e) $S_2$ to $S_0$ encodes 00 as 100.

Figure 9:
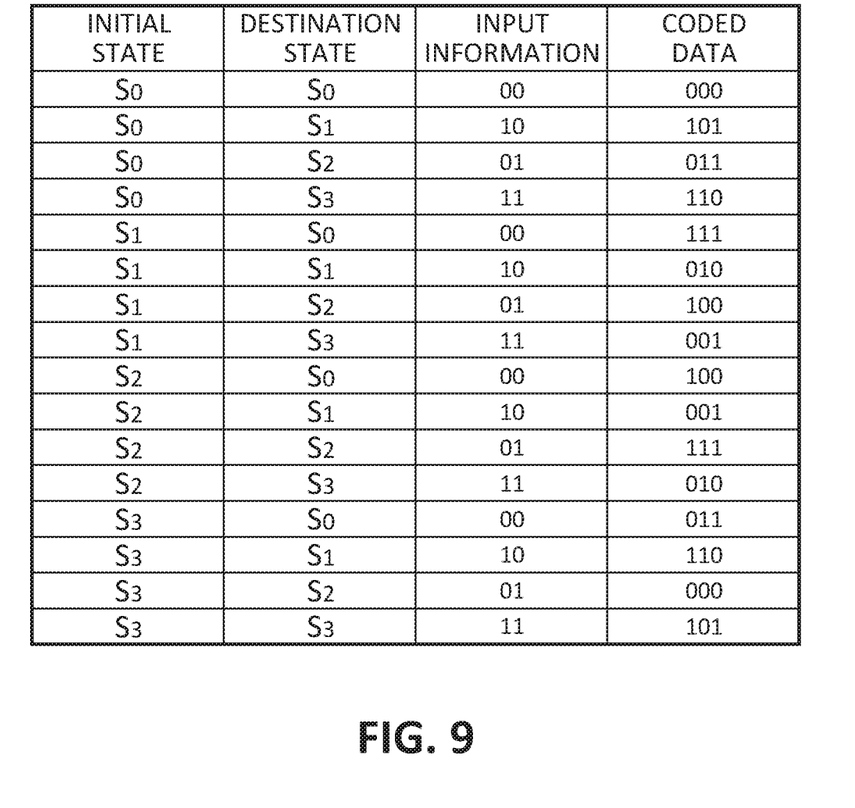
FIG. 9 is a table diagram showing the exemplary convolution encoding previously shown in FIG. 8, in table form.

FIG. 9, following is a table diagram showing the exemplary convolution encoding previously shown in FIG. 8 in table form, in which binary 10111110100 is convolution encoded into binary 101001101000100.

Figure 10:
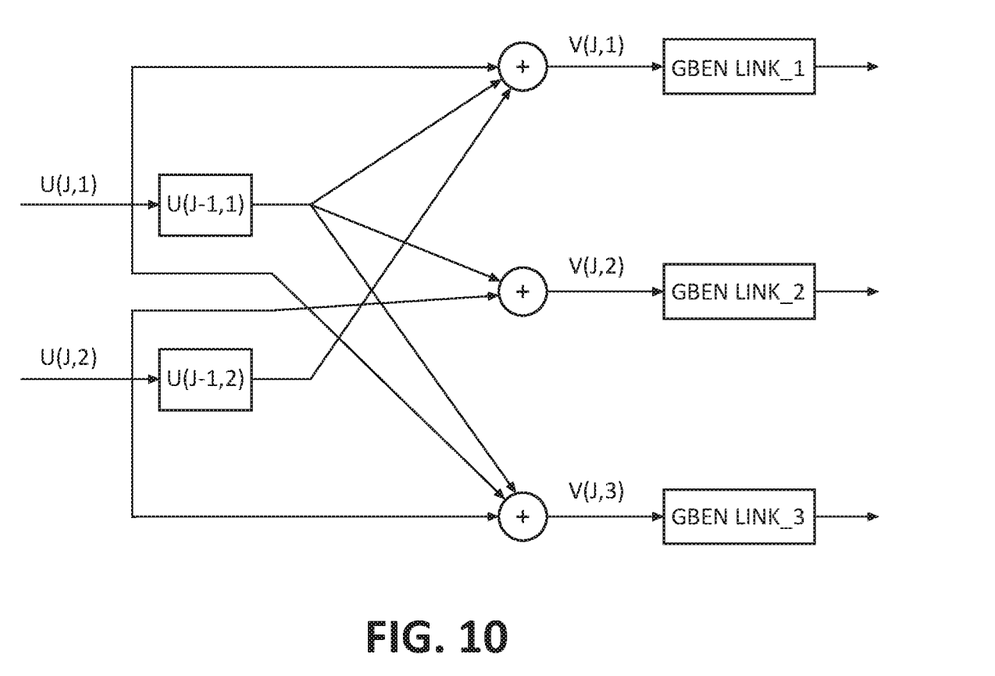
FIG. 10 is a block diagram illustration of an exemplary (3,2,1) Binary Convolution Encoder, again in which aspects of the present invention may be realized.

FIG. 10 is then the (3,2,1) convolution encoder itself, with 3 outputs, each output being a separate GbEN link (i.e., GBEN LINK_1, GBEN LINK_2, and GBEN LINK_3 as shown). Using 32 Gbps (Gigabits per second) links, the encoded data throughput is 96 Gbps and with a code rate of ⅔ (2 bits in gives 3 bits out), the effective data rate of original data is 64 Gbps, which is greater than a single link, thus showing the hyper-speed channel capability. Thus, in combination, one can achieve the robustness of convolution-trellis ENDEC (encoding-decoding), which enables safe increase of the effective data rate.

Figure 11:
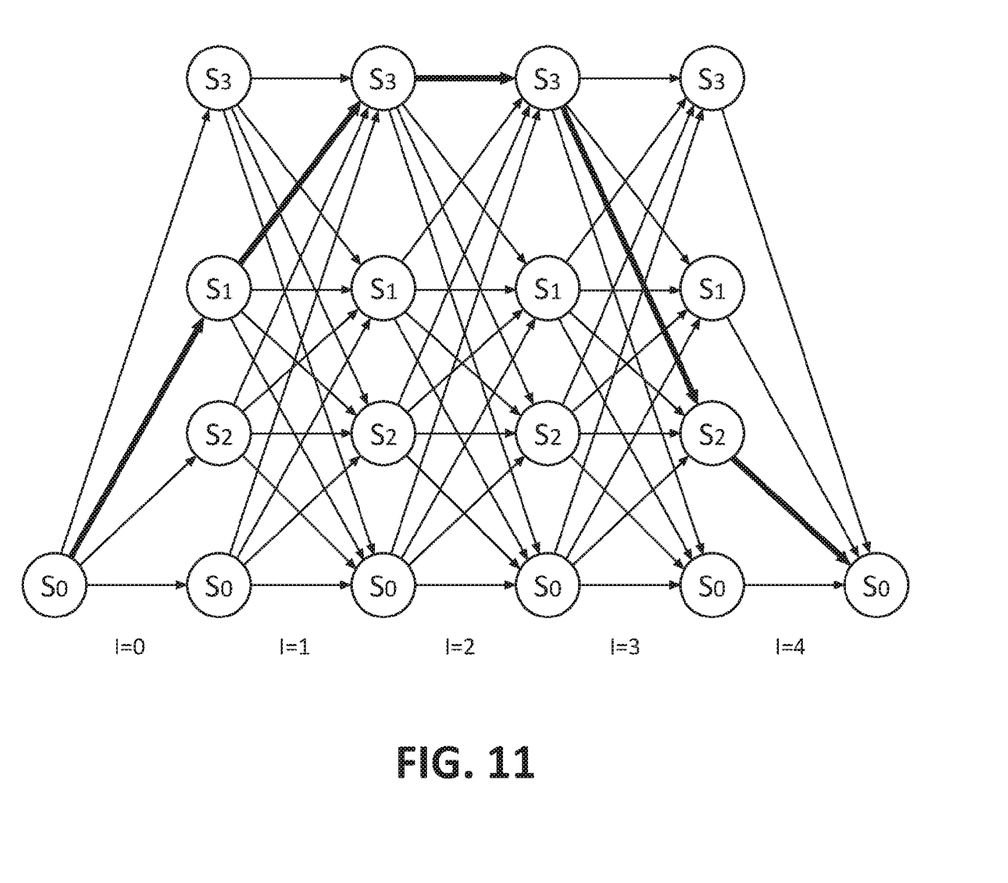
FIG. 11 is a trellis-decoding diagram for the (3,2,1) Binary Convolution Encoder previously illustrated in FIG. 10 and encoding illustrated in FIGS. 8 and 9, for exemplary decoding of binary 101001101000100 into the original binary 10111110100.

Thus, in FIG. 10, the original-data inputs U(J,1) and U(J,2) are convoluted into three separately transmitted message streams V(J,1), V(J,2), and V(J,3) which are transmitted on separate GbEN links (or FC, FCoE, Infiniband, SCSI, iSCSI, etc.,) and in FIG. 11, following, the original data is recovered even if a significant number of random bits are missing, by use of the XOR operator to find the path with zero Hamming radius. In FIG. 11, the depicted trellis diagram decodes 101001101000100 into original data 1011110100 (dark-highlighted line) by this process: (I=0) $S_0$ to $S_1$ decodes 101 as 10, (I=1) $S_1$ to $S_3$ decodes 001 as 11, (I=2) $S_3$ to $S_3$ decodes 101 as 11, (I=3) $S_3$ to $S_2$ decodes 000 as 01, (I=4) $S_2$ to $S_0$ decodes 100 as 00.

Figure 12:
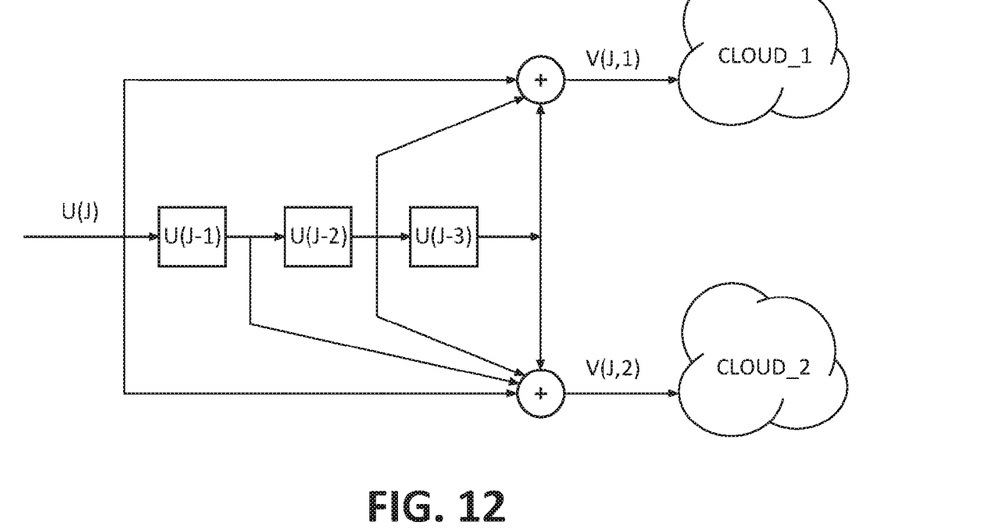
FIG. 12 is a block diagram illustration of an exemplary configuration of the exemplary (2,1,3) Binary Convolution Encoder previously depicted in FIG. 3, in which each output V(J,1) and V(J,2) is routed to a separate Cloud for storage purposes.
Figure 13:
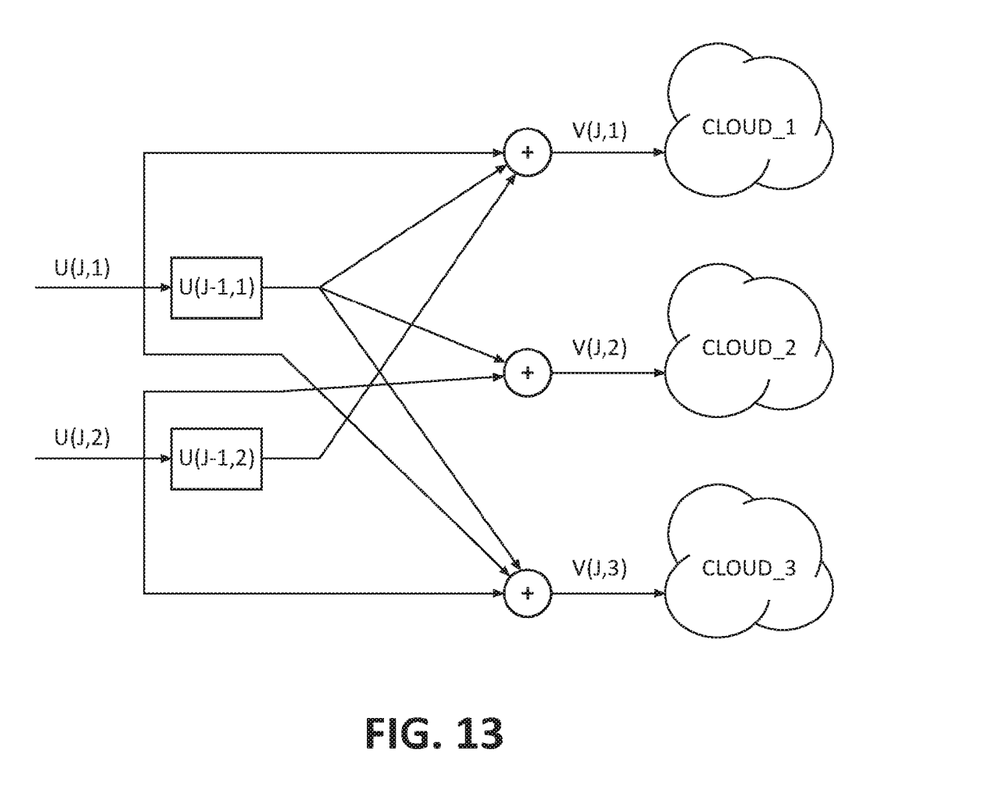
FIG. 13 is a block diagram illustration of an additional exemplary configuration of the exemplary (3,2,1) Binary Convolution Encoder previously depicted in FIG. 10, in which each output V(J,1), V(J,2), and V(J,3) is routed to a separate Cloud for storage purposes.

As an alternate embodiment, each output V(j,1) and V(J,2) of FIG. 3 and each output V(j,1), V(J,2), and V(J,3) of FIG. 10 could go to a separate Cloud for storage, as shown in FIGS. 12-13, respectively. This breaks up the original data U into pieces unintelligible to a malevolent hacker in any one of the clouds.

FIG. 12, following, then is a block diagram illustration of an exemplary configuration of the exemplary (2,1,3) Binary Convolution Encoder previously depicted in FIG. 3, in which each output V(J,1) and V(J,2) is routed to a separate Cloud (CLOUD_1 and CLOUD_2) for storage purposes.

Similarly, FIG. 13, following, is a block diagram illustration of an additional exemplary configuration of the exemplary (3,2,1) Binary Convolution Encoder previously depicted in FIG. 10, in which each output V(J,1), V(J,2), and V(J,3) is routed to a separate Cloud (CLOUDS_1-3) for storage purposes.

Figure 14:
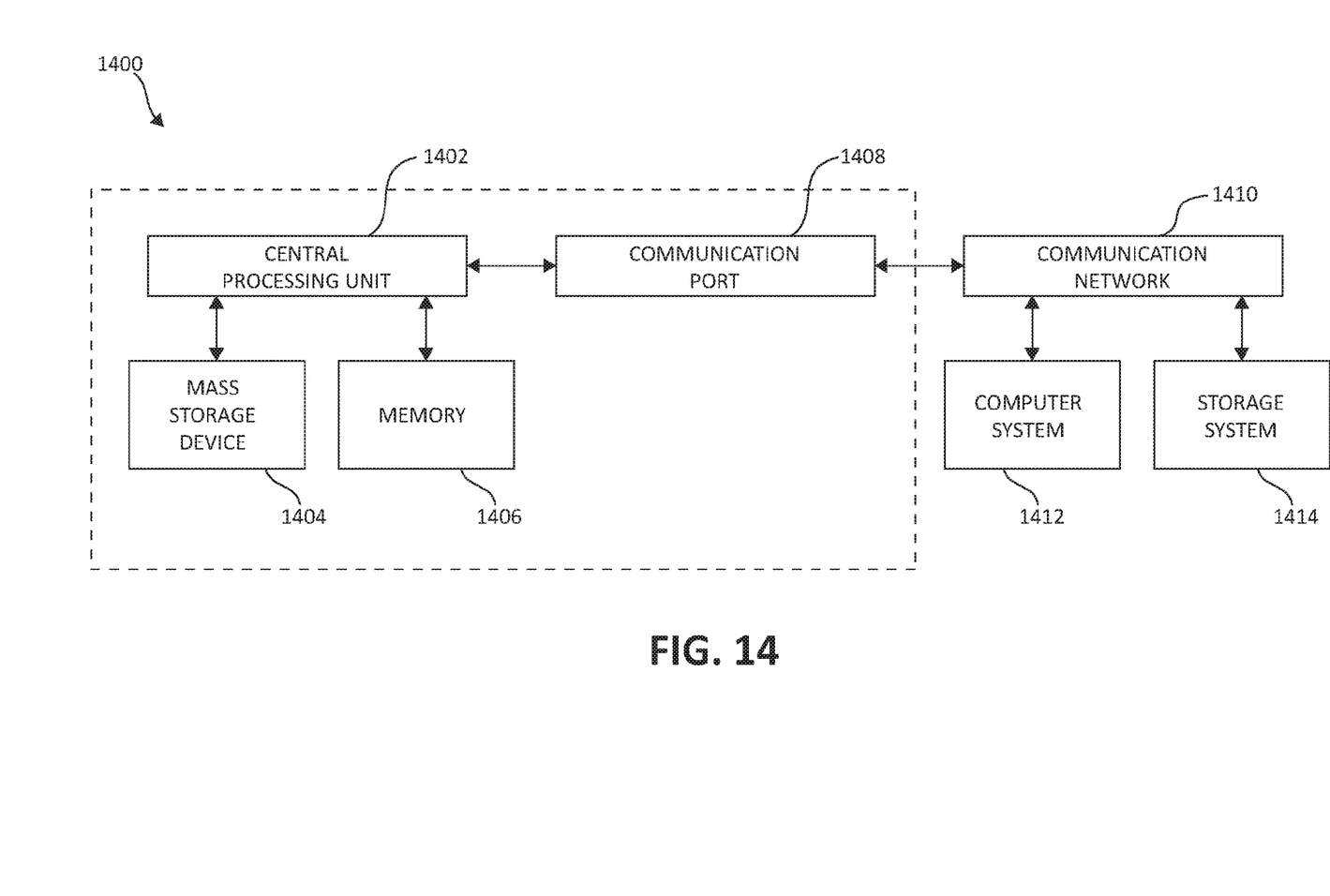
FIG. 14 is a block diagram of exemplary hardware, including at least one processor device, in which various aspects of the present invention may be implemented.

Finally, FIG. 14 is a block diagram of exemplary architecture 1400 of a computing system environment. Architecture 1400 may, in one embodiment, be implemented at least as part of a system for effecting mechanisms of the present invention such as the convolution encoding and trellis decoding functionality previously mentioned by use of the various components of architecture 1400. The computer system 1400 includes central processing unit (CPU) 1402, which is connected to communication port 1408 and memory device 1406, as well as mass storage device 1404. The communication port 1408 is in communication with a communication network 1410. The communication network 1410 and storage network may be configured to be in communication with server (hosts) 1412 and storage systems 1414, which may include other storage devices 1404. In one embodiment, storage systems 1414 are organized in the form of storage clouds. The storage systems may include hard disk drive (HDD) devices, solid-state devices (SSD) etc., which may be configured in a redundant array of independent disks (RAID). The operations as described below may be executed on storage device(s) 1404, located in architecture 1400 or elsewhere and may have multiple memory devices 1406 working independently and/or in conjunction with other CPU devices 1402. Memory device 1406 may include such memory as electrically erasable programmable read only memory (EEPROM) or a host of related devices. Memory device 1406 and storage devices 1404 are connected to CPU 1402 via a signal-bearing medium.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a Blu-Ray disk (BD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method for performing robust, parallel data transfer by a processor device, comprising:
   segmenting data into k-bit segments, where k≥1;
   convolution encoding the k-bit segments, using m≥1 stages of delay;
   transmitting n output streams in parallel for increased effective data rate, where n>k;
   receiving the n output streams; and
   applying an XOR (Exclusive OR) logic to the n output streams with pathing allowed by the convolution encoding, in a trellis-decoding diagram.

2. The method of claim 1, further including at least one of:
   identifying error-corrected data as an overall path with zero Hamming radius,
   identifying each packet of the data by sequence number and which output port of a convolution encoder the packet originated, and
   reassembling transmitted packets based on the sequence number and the output port.

3. The method of claim 1, further including generating $2^{km}$ states, with $2^k$ branches entering each state, and $2^k$ branches leaving each state.

4. The method of claim 1, further including sending each of the n output streams to a separate Cloud for storage.

5. The method of claim 1, wherein transmitting the output streams further includes transmitting each of the output streams along a discrete link for communication.

6. The method of claim 5, wherein transmitting each of the output streams along a discrete link for communication includes transmitting along one of a separate gigabit Ethernet network (GbEN) link, a Fibre Channel (FC) link, a Fibre Channel over Ethernet (FCoE) link, an Infiniband link, a Small Computer Systems Interface (SCSI) link, and an Internet Small Computer Systems Interface (iSCSI) link.

7. A system for performing robust, parallel data transfer, comprising:
   a processor device that:
     segments data into k-bit segments, where k≥1;
     convolution encodes the k-bit segments, using m≥1 stages of delay;
     transmits n output streams in parallel for increased effective data rate, where n>k;
     receives the n output streams; and
     applies an XOR (Exclusive OR) logic to the n output streams with pathing allowed by the convolution encoding, in a trellis decoding diagram.

8. The system of claim 7, further including a convolution encoder in operable communication with the processor device, wherein the convolution encoder encodes the k-bit segments.

9. The system of claim 7, wherein the processor device at least one of:
   identifies error-corrected data as an overall path with zero Hamming radius,
   identifies each packet of the data by sequence number and which output port of a convolution encoder the packet originated, and
   reassembles transmitted packets based on the sequence number and the output port.

10. The system of claim 7, wherein the processor device generates $2^{km}$ states, with $2^k$ branches entering each state, and $2^k$ branches leaving each state.

11. The system of claim 7, wherein the processor device sends each of the n output streams to a separate Cloud for storage.

12. The system of claim 7, wherein the processor device, pursuant to transmitting the output streams, transmits each of the output streams along a discrete link for communication.

13. The system of claim 11, wherein the discrete link further includes one of a separate gigabit Ethernet network (GbEN) link, a Fibre Channel (FC) link, a Fibre Channel over Ethernet (FCoE) link, an Infiniband link, a Small Computer Systems Interface (SCSI) link, and an Internet Small Computer Systems Interface (iSCSI) link.

14. A computer program product for performing robust, parallel data transfer by a processor device, the computer program product comprising a non-transitory computer-readable storage medium having computer-readable program code portions stored therein, the computer-readable program code portions comprising:
   a first executable portion that segments data into k-bit segments, where k≥1;
   a second executable portion that convolution encodes the k-bit segments, using m≥1 stages of delay;
   a third executable portion that transmits n output streams in parallel for increased effective data rate, where n>k;
   a fourth executable portion that receives the n output streams; and
   a fifth executable portion that applies an XOR (Exclusive OR) logic to the n output streams with pathing allowed by the convolution encoding, in a trellis decoding diagram.

15. The computer program product of claim 14, further including a sixth executable portion that at least one of:
   identifies error-corrected data as an overall path with zero Hamming radius,
   identifies each packet of the data by sequence number and which output port of a convolution encoder the packet originated, and
   reassembles transmitted packets based on the sequence number and the output port.

16. The computer program product of claim 14, further including a sixth executable portion that generates $2^{km}$ states, with $2^k$ branches entering each state, and $2^k$ branches leaving each state.

17. The computer program product of claim 14, further including a sixth executable portion that sends each of the n output streams to a separate Cloud for storage.

18. The computer program product of claim 14, further including a sixth executable portion that, pursuant to transmitting the output streams, transmits each of the output streams along a discrete link for communication.

19. The computer program product of claim 18, further including a seventh executable portion for, pursuant to transmitting each of the output streams along a discrete link for communication, transmitting along one of a separate gigabit Ethernet network (GbEN) link, a Fibre Channel (FC) link, a Fibre Channel over Ethernet (FCoE) link, an Infiniband link, a Small Computer Systems Interface (SCSI) link, and an Internet Small Computer Systems Interface (iSCSI) link.

\* \* \* \* \*